(12) United States Patent
Mueller et al.

(10) Patent No.: US 6,700,373 B2
(45) Date of Patent: Mar. 2, 2004

(54) METHOD FOR OPERATING A MAGNETIC RESONANCE APPARATUS EMPLOYING A SUPERIMPOSED ANATOMICAL IMAGE AND FUNCTIONAL IMAGE TO DESIGNATE AN UNRELIABLE REGION OF THE FUNCTIONAL IMAGE

(75) Inventors: Edgar Mueller, Heroldsbach (DE); Stefan Thesen, Meckenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/037,740

(22) Filed: Nov. 9, 2001

(65) Prior Publication Data

US 2002/0057086 A1 May 16, 2002

(30) Foreign Application Priority Data

Nov. 14, 2000 (DE) .......................... 100 56 457

(51) Int. Cl.[7] ................................. G01V 3/00
(52) U.S. Cl. ...................... 324/309; 324/307
(58) Field of Search .............. 324/309, 307, 324/306, 300; 600/410; 128/653.2

(56) References Cited

U.S. PATENT DOCUMENTS

| 4,558,462 A | * | 12/1985 | Horiba et al. ............... 382/42 |
| 5,565,777 A | * | 10/1996 | Kanayama et al. ......... 324/309 |
| 5,603,322 A | * | 2/1997 | Jesmanowicz et al. ..... 128/653.2 |
| 5,614,827 A | | 3/1997 | Heid ........................... 324/320 |
| 5,850,486 A | * | 12/1998 | Maas, III et al. ............ 382/294 |
| 5,869,964 A | * | 2/1999 | Kuhura et al. ............... 324/309 |
| 6,073,041 A | * | 6/2000 | Hu et al. ..................... 600/410 |
| 6,076,004 A | * | 6/2000 | Kanayama et al. ......... 600/410 |
| 6,226,352 B1 | * | 5/2001 | Salb ........................... 378/98.9 |

OTHER PUBLICATIONS

"Funktionelle Bildgebund mit der Magnetresonanztomographie," Klose et al, electromedica 67, vol. 1 (1999) pp. 27.
"Bold Magnetic Resonance Imaging in Real Time," Thesen et al, electromedica 68, vol. 1 (2000) pp. 45–52.
"Segmented Spin–Echo Pulses to Increase fMRI Signal; Repeated Intrinsic Diffusional Enhancement," Song et al, Rep Intrinsic Diffusional Enhancement, Song et al, Magnetic Resonance in Medicine, vol. 42 (1999) pp. 631–635.
"Correction for Geometric Distortion in Echo Planar Images from $B_0$ Field Variations," Jezzard et al, Magnetic R Medicine, vol. 34 (1995) pp. 65–73.

* cited by examiner

Primary Examiner—Diego Gutierrez
Assistant Examiner—Brij B. Shrivastav
(74) Attorney, Agent, or Firm—Schiff Hardin & Waite (57) ABSTRACT

In a method for the operation of a magnetic resonance apparatus an anatomical image of a region of an examination subject to be imaged is generated with a prescribable resolution and quality, a functional image of the region to be imaged is generated, the functional image is superimposed on the anatomical image, and at least one area of the region to be imaged wherein the functional image contains unreliable information is identified in the superimposition.

12 Claims, 6 Drawing Sheets

METHOD FOR OPERATING A MAGNETIC RESONANCE APPARATUS EMPLOYING A SUPERIMPOSED ANATOMICAL IMAGE AND FUNCTIONAL IMAGE TO DESIGNATE AN UNRELIABLE REGION OF THE FUNCTIONAL IMAGE

BACKGROUND OF THE INVENTION

1. Field of the Invention

The present invention is directed to a method for the operation of a magnetic resonance apparatus.

2. Description of the Prior Art

Magnetic resonance technology is a known technique for acquiring images of the inside of the body of a subject to be examined. In a magnetic resonance apparatus, rapidly switched gradient fields are superimposed on a static basic magnetic field. For triggering magnetic resonance signals, further, radio-frequency signals are emitted into the examination subject, the resulting magnetic resonance signals that are triggered being picked up, and image data sets and magnetic resonance images being produced on the basis thereof. The magnetic resonance signals are detected by a radio-frequency system, are demodulated in phase-sensitive fashion, and are converted into complex quantities by sampling and analog-to-digital conversion. These complex quantities are deposited as data points in a k-space dataset from which an image dataset, and thus a magnetic resonance image can be reconstructed with a multidimensional Fourier transformation.

Techniques referred to as functional imaging in medicine encompass all methods that utilize a repeated scanning of a structure of organs and tissues in order to image temporally changing processes such as physiological functions or pathological events. In the narrower sense, functional imaging in magnetic resonance technology is understood as measuring methods that make it possible to identify and image sensory stimuli and/or areolae in the nervous system stimulated by a motor, sensory or cognitive task, particularly the cerebral areolae of a patient. Acoustic and visual stimuli are examples of such sensory stimuli. In the simplest case, one of the sensory tasks comprises a defined movement, for example movement of the hand or of a finger.

The BOLD effect (Blood Oxygen Level Dependent) is the basis of functional magnetic resonance imaging. The BOLD effect is based on different magnetic properties of oxygenated and de-oxygenated hemoglobin in the blood. An intensified neural activity in the brain is assumed to be locally connected with an increased delivery of oxygenated blood, which causes a corresponding intensity boost at a corresponding location in a magnetic resonance image generated with a gradient echo sequence. The BOLD effect thereby occurs with a time delay of a few seconds relative to an event triggering the stimulation.

In functional magnetic resonance imaging, for example, three-dimensional image datasets of the brain are registered every two through four seconds, for example with an echo planar method. Echo planar methods thereby have the advantage that image dataset registration, at less than 100 ms required for an individual image dataset, is very fast. Image datasets with or without stimulation are thereby registered at different points in time. For forming a functional image, the image datasets registered with stimulation are subtracted from those without stimulation, i.e. the datasets are compared to one another for signal differences for identifying active brain areas.

In magnetic resonance technology, the homogeneity of the basic magnetic field is a decisive factor for the quality of the magnetic resonance images. Inhomogeneities of the basic magnetic field within an imaging volume of a magnetic resonance apparatus cause geometrical distortions of the magnetic resonance image that are proportional to the inhomogeneities. The homogeneity in sequences referred to as fast pulse sequences is especially important, for example in the echo planar method.

Recent developments in magnetic resonance apparatuses have been directed to creating devices with an examination space for the acceptance of the examination subject, for example a patient, that is accessible from all sides insofar as possible for the purpose of intra-operational interventions, and that is designed as spacious and open as possible because of patients having a tendency toward claustrophobia. The problem of distortions, particularly at the edges of the imaging volume and given an apparatus with a strong basic magnetic field, is intensified in these types of devices due to their very design.

Shim systems are utilized for improving the basic magnetic field homogeneity within the imaging volume. In a passive shim system, iron plates are attached in a suitable arrangement within the imaging volume. To that end, the basic magnetic field within the imaging volume is measured before the iron plates are attached. A calculating program determines the suitable number and arrangement of the iron plates from the measured values.

In an active shim system, shim coils that can be respectively charged with direct currents are utilized for homogenization of the basic magnetic field. Power pack devices that supply extremely constant and reproducibly adjustable direct currents are required for the operation of the shim coils. Among other things, an active shim system is used for fine correction when it is a matter of extremely high homogeneity is needed, for example in order to correct the field distortions caused by the examination subject at least partly placed in the imaging volume, particularly the field distortion within the examination subject.

As disclosed, for example, in German PS 195 11 791, the basic magnetic field within the imaging volume can be described with coefficients of a spherical function series expansion. This document also discloses correction of a linear inhomogeneity of the basic magnetic field, i.e. a field disturbance of the first order, by charging a gradient coil with an offset current. The offset current is a constant current that is superimposed on a gradient coil current that implements the gradient sequence. For compensating inhomogeneities of a higher order, a respective shim coils that each essentially compensate one of the coefficients are provided in conformity with the field disturbance to be compensated.

Due to the field-distorting effect of the examination subject, a shim setting procedure is implemented during the course of production of magnetic resonance images. Shim currents for the individual shim coils and offset currents for the gradient coils identified, for example once the region to be imaged has been positioned in the imaging volume. According to the aforementioned German PS 196 11 791, magnetic resonance signals of the examination subject are generated therefor with different echo times for forming two three-dimensionally spatially resolved raw datasets. The raw datasets are further-processed for determining corresponding shim and offset currents.

After the shim and offset currents have been set, non-compensated inhomogeneities of a higher order that continue to cause distortions in the magnetic resonance images are among the things that remain. The distortions in the phase-coding direction are dominant in the classic echo planar method. These distortions can be calculated out of the magnetic resonance image to a certain extent using a field map that describes inhomogeneities of the basic magnetic field. The field map is generated temporally after a setting of the active shim system, for example with a double echo gradient echo sequence. This technique for distortion-correction with a field map is explained in greater detail in, for example, the article by P. Jezzard et al., "Correction for Geometric Distortion in Echo Planar Images from $B_0$ Field Variations", Magnetic Resonance in Medicine 34, 1995, pages 65–73. The precision and accuracy of the distortion correction are thus in direct dependency on the degree of a local distortion.

SUMMARY OF THE INVENTION

An object of the invention is to provide an improved method for the operation of a magnetic resonance apparatus with which, among other things, the quality of the functional information can be taken into consideration.

This object is achieved in accordance with the invention in a method for the operation of a magnetic resonance apparatus wherein an anatomical image of a region of an examination subject to be imaged is generated with a prescribable resolution and quality, a functional image of the region to be imaged is generated, the functional image is superimposed on the anatomical image, and at least one area of the region to be imaged wherein the functional image contains unreliable information is correspondingly identified in the superimposition.

As a result thereof, areas with questionable or suspicious functional information are emphasized for a diagnostician, so that a local quality of the functional information can be estimated and misinterpretations and/or misdiagnoses connected therewith can be reduced.

DESCRIPTION OF THE PREFERRED EMBODIMENTS

Figure 1:
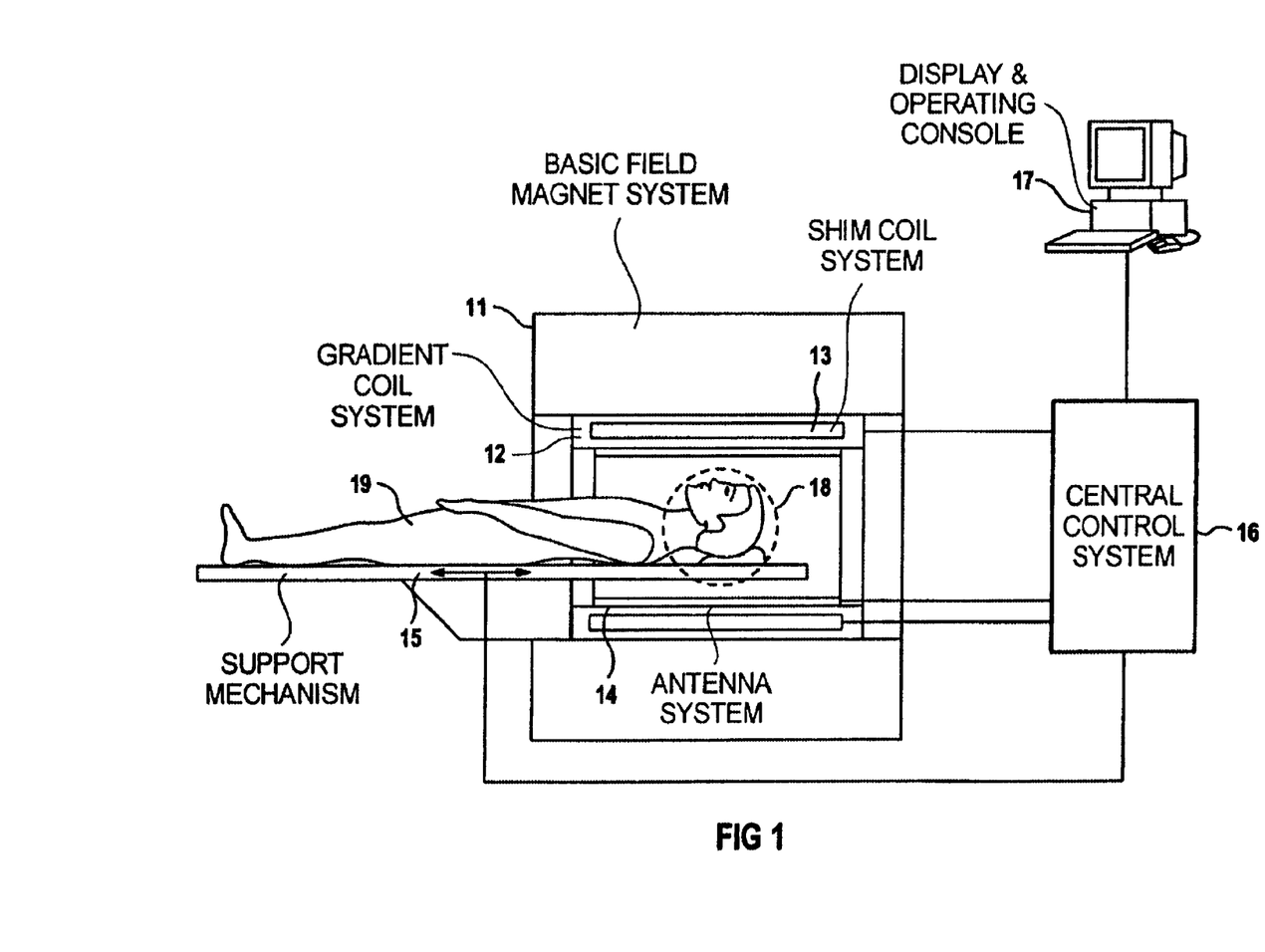
FIG. 1 is a schematic illustration of a magnetic resonance apparatus constructed and operating in accordance with the invention.

FIG. 1 shows a sketch of a magnetic resonance apparatus. The apparatus has a basic field magnet system 11 for generating a basic magnetic field and a gradient coil system 12 for generating gradient fields. A shim coil system 13 is integrated into the gradient coil system 12 for homogenization of the basic magnetic field. The apparatus further has an antenna system 14 that emits radio-frequency signals into an examination subject for triggering magnetic resonance signals and picks up the magnetic resonance signals that are generated. Further, the apparatus comprises a movable bearing device 15 on which the examination subject, for example a patient 19 to be examined, is placed.

For controlling currents in the shim coil system 13, as well as for controlling currents in the gradient coil system 12 on the basis of a sequence, the shim coil system 13 as well as the gradient coil system 12 are connected to a central control system 16. The antenna system 14 is likewise connected to the central control system 16 for controlling the radio-frequency signals to be emitted according to the sequence as well as for the further-processing and storing of the magnetic resonance signals picked up by the antenna system 14. For controlling displacement of the movable support device 15, for example in order to position a region of the patient 19 to be examined in an imaging volume 18 of the apparatus, the support device 15 also is connected to the central control system 16. The central control system 16 is connected to a display and operating console 17 via which the inputs of an operator, for example the desired sequence type and sequence parameters, are supplied to the central control system 16. Among other things, further, the generated magnetic resonance images are displayed at the display and operating console 17.

Figure 2:
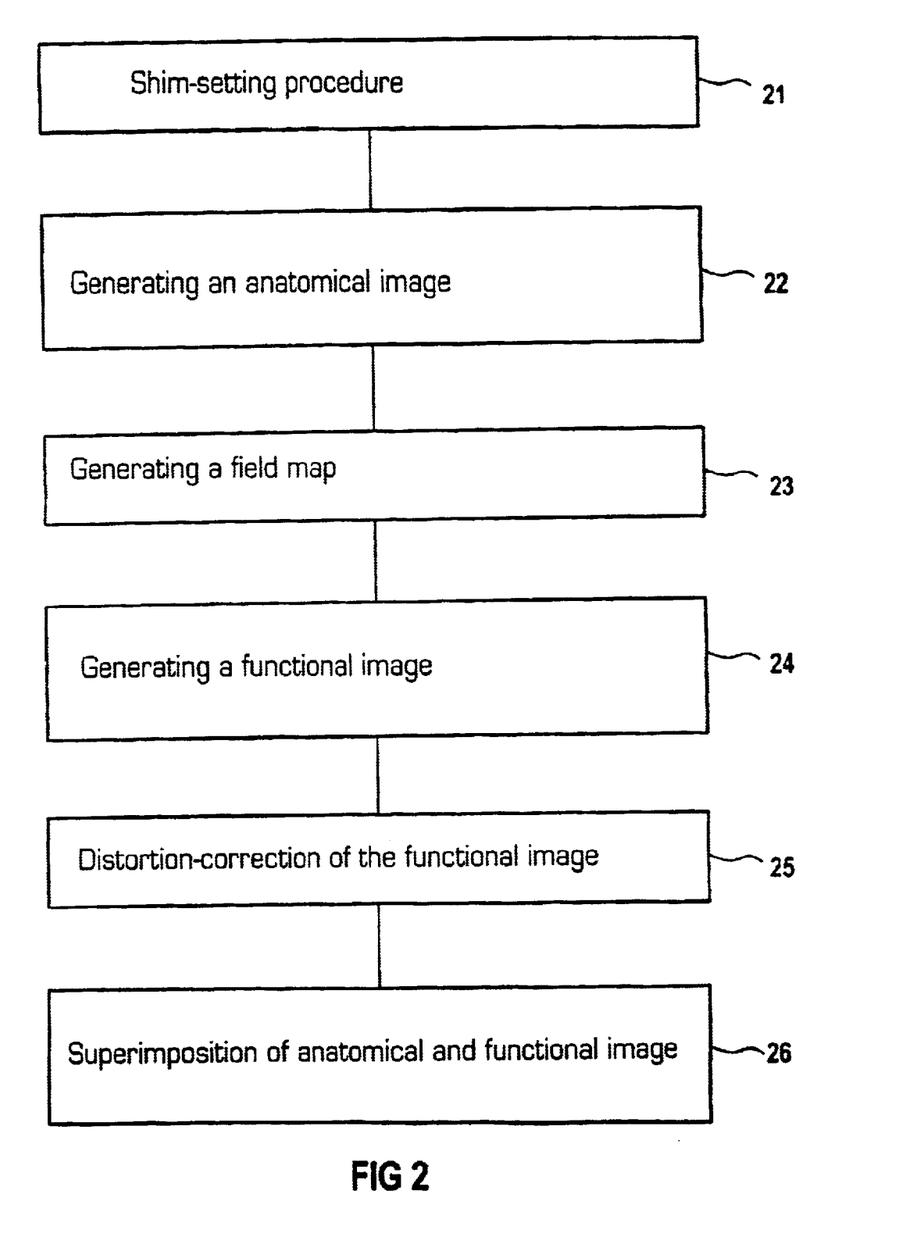
FIG. 2 is a flowchart for a method for the operation of a magnetic resonance apparatus in accordance with the invention.

FIG. 2 shows a flowchart for the inventive method for the operation of a magnetic resonance apparatus. The magnetic resonance apparatus shown in FIG. 1 is referenced as an example. First, the region of the patient placed on the support mechanism 15 to be imaged, for example the patient's head, is positioned in the imaging volume 18 of the apparatus by displacement of the support mechanism 15.

After this positioning, a shim-setting procedure is implemented in step 21 of the flowchart of FIG. 2. Shim currents are thereby determined for the shim coil system 13 and offset currents are determined for the gradient coil system 12, for example according to a method of German PS 195 11 791, which has already been cited. To that end, magnetic resonance signals of the head are generated with different echo times for forming two three-dimensionally spatially resolved raw datasets, and the raw datasets are further-processed for determining corresponding shim and offset currents. A significantly lower resolution than for the diagnostic imaging is generally adequate. For example, one can generally manage with 32 voxels for each spatial direction, i.e. with raw datasets having the size of 32×32×32 voxels.

In step 22 of the flowchart, an anatomical magnetic resonance image of the head is generated with a high resolution and quality. A multi-slice technique based on spin echos, for example, is utilized, slices of the anatomical image having a resolution of 256×256 voxels, for example, being able to be generated therewith.

In step 23 of the flowchart, a field map with respect to inhomogeneities of the basic magnetic field is generated at least for the region to be imaged, using a double echo gradient echo sequence similar to the shim-setting procedure. A high resolution similar to that for the anatomical magnetic resonance image is sought.

In step 24 of the flowchart, functional images of the head, particularly of the brain, are taken by functional magnetic resonance imaging. To that end, three-dimensional image datasets of the head are registered with an echo planar method before and after a stimulation of the patient 19, before and after a task carried out by the patient 19, these being subtracted from one another for forming the afore-mentioned functional images. Although echo planar methods enable a very fast registration of comparatively large three-dimensional image data sets, they exhibit a comparatively poor image quality and, generally, a lower resolution of, for example, 128×128×128 voxels.

The functional images are distortion-corrected in a further step 25. For example, the distortion correction is implemented according to the method that is described in the initially cited article by P. Jezzard. An unambiguous distortion correction is not possible for all sub-areas of the region to be imaged. When, for example, the distortion is very pronounced locally, so that a registered voxel must be distortion-corrected with respect to twenty voxels, this cannot be implemented with unambiguous values for all twenty voxels. The reason for this is that the informational content of one registered voxel is inadequate by itself in order to be able to reconstruct the values for the twenty voxels that correspond to the actual conditions.

The distortion-corrected functional images are superimposed on the anatomical image in a further step 26. In the superimposition, areas of the brain from which no reliable functional information can be acquired and/or for which no unambiguous distortion correction can be implemented are identified by designated areas, such as blocked-out areas. Areas from which no reliable functional information can be acquired correspond to those areas of the field map in which the inhomogeneity of the basic magnetic field exceeds a prescribable value, so that no magnetic resonance signals can be acquired from these areas with the echo planar method due to dephasing effects. Further, the areas for which no unambiguous distortion correction can be implemented can likewise be identified with the assistance of the field map. Areas of the field map in which the inhomogeneity of the basic magnetic field lies in a prescribable region thereby indicate the areas that cannot be accurately distortion-corrected.

In another embodiment, the steps 22 and 23 are combined, so that the anatomical image and the field map are generated simultaneously, for example with a double echo gradient echo sequence. In yet another embodiment, the shim-setting procedure of step 21 is implemented with such a high resolution that the field map can be simultaneously derived therefrom while eliminating the step 23.

Figure 3:
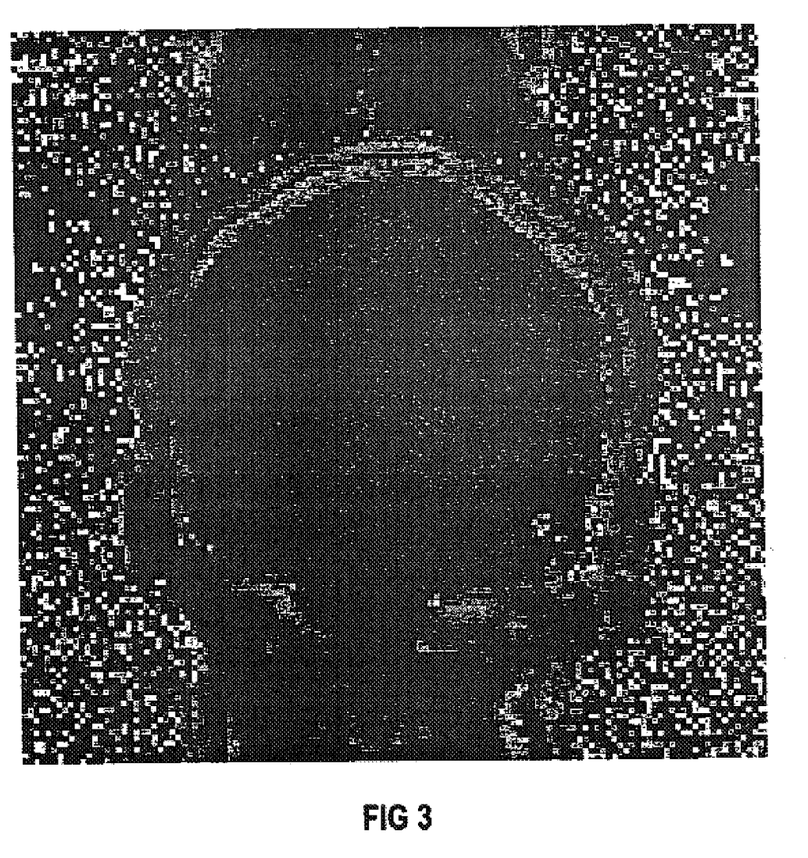
FIG. 3 is a field map of a coronary slice of a head used in an embodiment of the inventive method.

With reference to the example of a coronary slice of the head, FIG. 3 shows a field map that is generated with the double echo gradient echo sequence. Respective image dataset that each contain complex quantities are registered for the two echos of the double echo gradient echo sequence that exhibit different echo times. For forming the field map, the phase values of the appertaining complex quantities for corresponding data points of the two image datasets are subtracted from one another. Corresponding to the initially cited article by P. Jezzard, the double echo gradient echo sequence is designed such that artifacts in the field map due to a chemical shift, for example due to a fat resonance, are suppressed.

Figure 4:
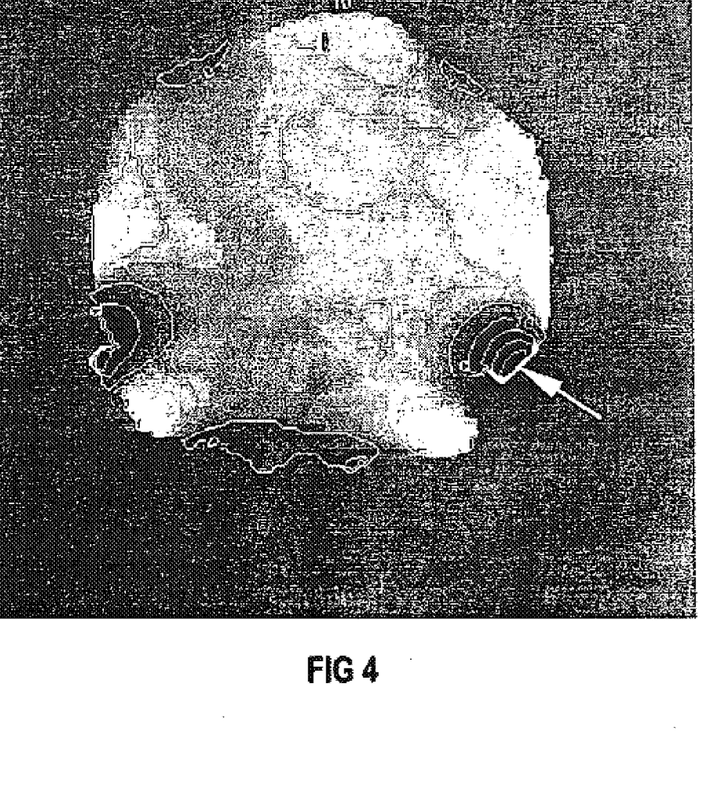
FIG. 4 is the field map of FIG. 3 showing isometric lines of a polynomial surface obtained by curve fitting.

FIG. 4 shows a part of the field map of FIG. 3 essentially pertaining to the brain 60 of the head in which isomers of a polynomial surface, obtained by curve fitting, are displayed. The fitting is thereby likewise described in the initially cited article by P. Jezzard. In order to identify the points for FIG. 4 from the field map of FIG. 3 that essentially relate to the brain 60 that are of interest for the functional magnetic resonance imaging, for example, only those data points of the image datasets are further-processed whose complex quantities exceed a prescribable limit in terms of amount. Given the fitted field map of FIG. 4, areas having a comparatively high inhomogeneity of the basic magnetic field are shown dark and areas having a comparatively good homogeneity are shown light.

Figure 5:
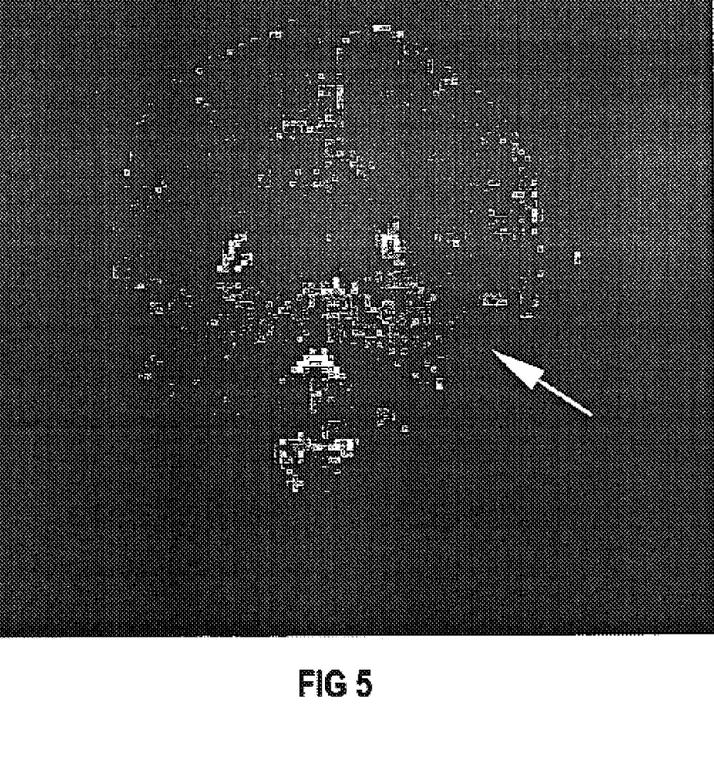
FIG. 5 is an anatomical image of the coronary slice of the image of FIG. 3.

FIG. 5 shows an anatomical image for the coronary slice of FIG. 3, this image proceeding, for example, from one of the two image datasets. A white arrow marks an area in the region of an auditory canal. Due to a tissue-air boundary surface of the auditory canal, a dephasing of magnetic resonance signals occurs in this area and, thus, a signal quenching occurs in the magnetic resonance image. This area is thereby shown congruently in FIG. 4 as an area of high inhomogeneity.

Figure 6:
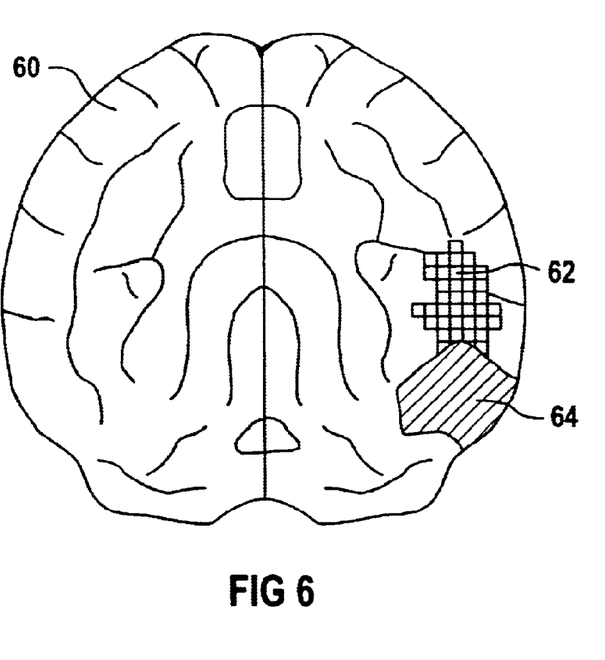
FIG. 6 is an anatomical image of the brain with functional information and with an area identified as containing unreliable functional information in accordance with the inventive method.

Corresponding to FIG. 5, FIG. 6 shows an anatomical image of the brain 60 as a basis for the superimposition of functional images of said coronary slice of the brain 60. As an example, a stimulated cerebral areola 62 is shown as the functional information. The area of high inhomogeneity identified according to FIG. 4 is permanently occupied with a blocked-out surface 64. The blocked-out surface 64 identifies a region from which no reliable functional information can be acquired as a consequence of dephasing effects and/or ambiguous distortion correction of a functional image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising the steps of:

generating a magnetic resonance anatomical image of a region of an examination subject with a selected image resolution and image quality;

generating a magnetic resonance functional image of said region;

superimposing said magnetic resonance functional image on said magnetic resonance anatomical image to produce a superimposition image; and in said superimposition image, designating at least one area of said region wherein said magnetic resonance functional image contains unreliable information.

2. A method as claimed in claim 1 comprising the step, before superimposing said magnetic resonance functional image on said magnetic resonance anatomical, of distortion-correcting said magnetic resonance functional image for which unambiguous distortion correction cannot be implemented, and designating said area for which unambiguous distortion correction cannot be implemented as said area in said superimposition image containing unreliable information.

3. A method as claimed in claim 1 comprising designating said area in said superimposition by using a field map of said region and, in said field map identifying an area wherein inhomogeneities of a basic magnetic field exceed a predetermined threshold.

4. A method as claimed in claim 3 comprising generating said field map using a double echo gradient echo sequence.

5. A method as claimed in claim 3 wherein each of said magnetic resonance anatomical image and said magnetic resonance functional image are obtained in a magnetic resonance imaging apparatus having an active shim system, and comprising generating said field map following positioning of said region in said apparatus and following setting of values for said active shim system.

6. A method as claimed in claim 1 comprising designating said area as a blocked-out region in a display of said superimposition image.

7. A method as claimed in claim 6 comprising chromatically designating said blocked-out region.

8. A method as claimed in claim 6 comprising designating said blocked-out region by hatching.

9. A method as claimed in claim 1 comprising generating said magnetic resonance functional image with an image resolution that is poorer than said image resolution of said magnetic resonance anatomical image.

10. A method as claimed in claim 1 comprising generating said magnetic resonance functional image with an image quality that is poorer than said image quality of said magnetic resonance anatomical image.

11. A method as claimed in claim 1 comprising generating said magnetic resonance functional image with an image resolution that is poorer than said image resolution of said magnetic resonance anatomical image and with an image quality that is poorer than said image quality of said magnetic resonance anatomical image.

12. A method as claimed in claim 1 comprising generating said magnetic resonance functional image with an echo planar sequence.

* * * * *